(12) United States Patent
Kobayashi

(10) Patent No.: US 6,303,968 B1
(45) Date of Patent: Oct. 16, 2001

(54) SEMICONDUCTOR LIGHT-RECEIVING ELEMENT

(75) Inventor: Takanobu Kobayashi, Tokyo (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/490,327

(22) Filed: Jan. 24, 2000

(30) Foreign Application Priority Data

Aug. 26, 1999 (JP) .................................................. 11-239661

(51) Int. Cl.[7] ..................... H01L 31/0232; H01L 31/075; H01L 31/105
(52) U.S. Cl. ........................... 257/435; 257/458; 257/452; 257/457
(58) Field of Search .................................... 257/435, 448, 257/452, 457

(56) References Cited

U.S. PATENT DOCUMENTS

| | | | |
|---|---|---|---|
| 5,040,039 | * | 8/1991 | Hattori et al. . |
| 5,045,906 | * | 9/1991 | Nagaya . |
| 5,585,653 | * | 12/1996 | Nakashiba . |
| 5,635,707 | * | 6/1997 | Shimizu . |
| 5,736,756 | * | 4/1998 | Wakayama et al. . |
| 5,866,936 | * | 2/1999 | Hasnain et al. . |

FOREIGN PATENT DOCUMENTS 08018088A 1/1996 (JP) .

\* cited by examiner

Primary Examiner—Stephen D. Meier
(74) Attorney, Agent, or Firm—Venable; James R. Burdett

(57) ABSTRACT

An ohmic electrode for electrically connecting a shielding metal film and a window layer is provided to a semiconductor light-receiving element in which stray light is controlled by the shielding metal film. In this semiconductor light-receiving element, the ohmic electrode is disposed such that it encircles a $p^+$ diffusion region while kept in contact with the window layer on a substrate. Crack propagation from the edgewise region into the ohmic electrode is thereby impeded.

16 Claims, 3 Drawing Sheets

SEMICONDUCTOR LIGHT-RECEIVING ELEMENT

BACKGROUND OF THE INVENTION

1. Field of the Invention

The present invention relates to a semiconductor light-receiving element.

2. Description of Related Art

A common conventional semiconductor light-receiving element (photodiode) performs optoelectric conversion in which light incident on a light-receiving surface is diverted to the depletion layer of a light-absorbing layer immediately below a diffusion region.

An example of such a semiconductor light-receiving element is disclosed in Reference I (Japanese Unexamined Patent Application (Kokai) 8-18088). The semiconductor light-receiving element of Reference I prevents stray light from being generated because light from outside the light-receiving surface is blocked by a shielding metal film provided along the perimeter of the light-receiving surface. In addition, the shielding metal film does not create stray capacitance because this shielding metal film is electrically connected to a window layer via an ohmic electrode. Consequently, using the technique of Reference I makes it possible to realize a semiconductor light-receiving element having excellent element characteristics.

It is known, however, that outside force, stress, or the like causes cracking or chipping on the surface of a semiconductor light-receiving element during production or operation of this element. Consequently, the substrate around the light-receiving surface is commonly cracked or chipped during production or operation. Such cracking of chipping is not limited to the technique disclosed in Reference I.

For example, dicing, scribing or the like (hereinafter referred to as "dicing or the like"), is used in an element splitting process in which a plurality of semiconductor light-receiving elements formed as an array on a wafer are cut and separated. Wafers are commonly cut while being bonded to a wafer sheet or the like. When cracks form near the cutting surface during the cutting of wafers by dicing or the like, these cracks grow during the operation of the semiconductor light-receiving element, sometimes reaching the diffusion region. In a common semiconductor light-receiving element, a crack reaching all the way into the diffusion region alters element characteristics or causes element failure. The above-described excellent element characteristics are adversely affected as a result.

In the semiconductor light-receiving element of Reference I, an ohmic electrode is provided, for example, on opposite sides (areas that face each other) of a substrate surface, but these opposite-side areas of the substrate surface occasionally break off.

Such breakage occurs, for example, when a semiconductor light-receiving element is handled by pincers or the like during the mounting of the element. In the process, the shielding metal film is brought into an electrically floating state if the ohmic electrode on the opposite sides of the substrate surface has broken off. The above-described excellent element characteristics are adversely affected as a result.

SUMMARY OF THE INVENTION

In view of the above, an object of the present invention is to provide a semiconductor light-receiving element whose element characteristics are only minimally affected by the cracking, chipping, or the like occurring during the fabrication or mounting of the semiconductor light-receiving element.

To attain the stated object, the following unique structure has been adopted for the semiconductor light-receiving element of the present invention. Specifically, the semiconductor light-receiving element of the present invention comprises a light-absorbing layer of a first conduction type and a window layer of the first conduction type sequentially formed on the first principal surface of a substrate of the first conduction type. In the present invention, part of the window layer is provided with a diffusion region of a second conduction type that reaches as far as the boundary between the window layer and the light-absorbing layer. Another feature of the present invention is that a shielding film cladding is formed on the window layer around the diffusion region. Yet another feature of the present invention is that the shielding film cladding is constructed by cladding a shielding metal film and an insulating film. Still another feature of the present invention is that the shielding metal film is part of the shielding film cladding and is electrically connected to the window layer by means of an ohmic electrode. According to the present invention, the ohmic electrode is provided such that it is in contact with the window layer and encircles the diffusion region.

In this structure, the shielding metal film contained in the shielding film cladding is electrically connected to the window layer by the ohmic electrode, and this ohmic electrode encircles the diffusion region. It is therefore possible to suppress generation of stray light because light coming from outside the light-receiving surface can be blocked by the shielding metal film provided around the light-receiving surface. In addition, the shielding metal film does not generate any stray capacitance because this shielding metal film is electrically connected to the window layer by means of the ohmic electrode. In other words, the excellent characteristics of the semiconductor light-receiving element in Reference I can be easily afforded.

In particular, actions and effects (1) and (2) below can be achieved because the ohmic electrode in the above-described structure is provided such that it is in electrical contact with the window layer and encircles the diffusion region.

(1) When cracks form at the edges of the cutting surfaces or other areas of a semiconductor light-receiving element substrate during pincer handling or element splitting, these cracks can be prevented from reaching all the way inside the ohmic electrode because the ohmic electrode is formed such that it is in contact with the window layer. This is because the material for forming the ohmic electrode diffuses (usually by thermal diffusion) into the area of the substrate provided with the ohmic electrode, increasing the strength of the substrate in this area. With this structure, therefore, cracks are less likely to reach the diffusion region, and the adverse effect of cracks on the element characteristics can be controlled.

(2) When, for example, the ohmic electrode provided to the opposite sides of an element breaks off during mounting, the excellent characteristics of the semiconductor light-receiving element in Reference I are still prevented from being adversely affected because the ohmic electrode maintains electric conductivity between the window layer and the shielding metal film in areas outside these sections. This structure therefore makes it possible to control deterioration in element characteristics due to cracking or chipping.

In working the present invention, the substrate should preferably be an indium/phosphorus-based substrate.

Indium/phosphorus-based substrates are generally useful for obtaining wide-ranging photosensitive wavelengths, but these substrates are known to be weak materials. For this reason, semiconductor light-receiving elements obtained using indium/phosphorus-based substrates are apt to develop cracks, chips, or the like, causing the above-described element characteristics to decline considerably. When, however, an ohmic electrode is provided in the manner described above, the deterioration of element characteristics can be controlled, as described in (1) and (2) above.

In working the present invention, it is particularly preferable that a connection electrode be further provided for electrically connecting the ohmic electrode and the shielding metal film.

When an ohmic electrode and a shielding metal film are connected directly, an inadequate connection occasionally forms between the two because step coverage defects develop during the formation of the ohmic electrode. Such connection defects are less likely to develop, however, when the ohmic electrode and the shielding metal film are connected by means of a connection electrode.

The diffusion region should preferably be provided with a first main electrode in contact with the diffusion region, and the aforementioned connection electrode should preferably be formed from the same electroconductive material as that of the first main electrode. Forming the connection electrode and the first main electrode from the same material allows the first connection electrode and the first main electrode to be formed by the same process. The connection electrode may therefore be formed concurrently with the first main electrode without adding any particular processes. Production time can therefore be reduced.

In working the present invention, it is particularly preferable that the ohmic electrode be provided in the edgewise region of the substrate along the external periphery of the substrate.

The cracks that are likely to spread from the external periphery of the substrate will therefore be limited to the area near the edges of the substrate, making it more difficult for the cracks to form in the diffusion region or other regions.

In working the present invention, the second principal surface of the substrate should preferably be provided with a second main electrode.

In working the present invention, the substrate should preferably be an InP substrate, the light-absorbing layer an InGaAs layer, and the window layer an InP layer.

In working the present invention, it is particularly preferable that an InP buffer layer be provided between the InP substrate and the InGaAs layer.

According to a preferred embodiment of the present invention, part of the diffusion region functions as a light-receiving surface, and an antireflection film is formed on this light-receiving surface.

According to another preferred embodiment of the present invention, the light-nonreceiving surface of the diffusion region is provided with a first main electrode in contact with this diffusion region.

According to yet another preferred embodiment of the present invention, the light-receiving surface is shaped as a circular flat pattern, and the light-nonreceiving surface is configured as a crescent-shaped flat pattern adjacent to the light-receiving surface within the same plane.

In working the present invention, a silicon nitride film can be used as the above-described insulating film.

In working the present invention, the ohmic electrode should preferably be formed from an alloy of gold (Au) and zinc (Zn) if the connection electrode is formed from gold (Au). Ohmic contact can thus be easily realized.

In working the present invention, the shielding metal film should preferably be formed from titanium (Ti) or molybdenum (Mo).

In working the present invention, the ohmic electrode should preferably be electrically connected to the window layer at a position farther away from the diffusion region than the width of a depletion layer formed around the diffusion region. This approach reduces the likelihood that short circuits will occur between the diffusion region and the ohmic electrode.

In working the present invention, an arrangement should preferably be adopted in which the diffusion region is provided with a first main electrode in contact with this diffusion region, a discontinuous section is provided to a curvilinear pattern obtained by forming an electrode pattern from the ohmic electrode, and this discontinuous section is disposed as close as possible to the first main electrode. A bonding wire or other component for connecting the first main electrode to the outside is provided above the discontinuous section. Such a structure makes it less likely that a connection electrode will be shorted by the breakage of the bonding wire or the like.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
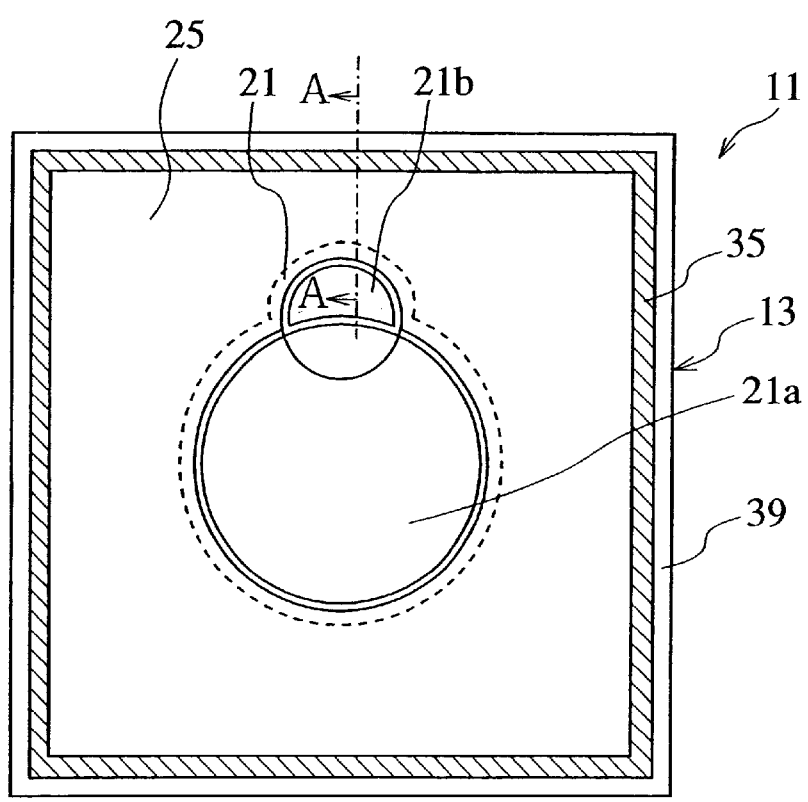
FIG. 1 is a plan view schematically depicting a semiconductor light-receiving element (planar photodiode) that pertains to an embodiment.

Embodiments of the proposed semiconductor light-receiving element will now be described with reference to drawings. The drawings used in the description are merely schematic representations of the shape, size, and configurational relation of structural components intended to illustrate the present invention. In addition, identical structural components in the drawings are designated by the same symbols, and redundant descriptions thereof are occasionally omitted. Furthermore, the devices used, materials used, numerical conditions, and other items described below are merely examples that fall within the scope of the present invention, and are not limiting of the present invention.

Figure 2:
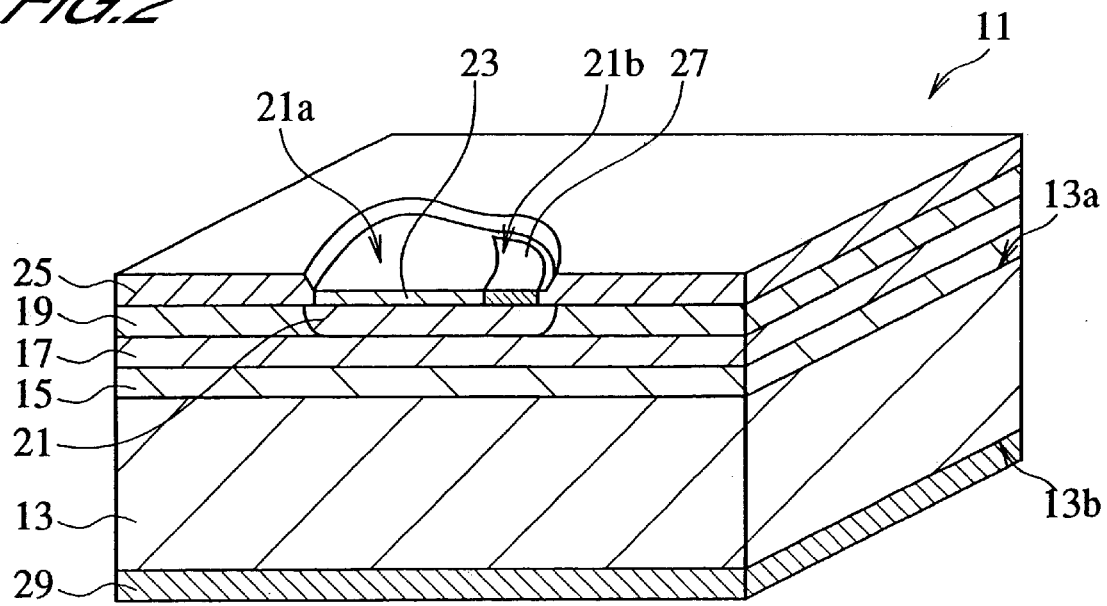
FIG. 2 is a fragmentary perspective cross-sectional view of the semiconductor light-receiving element in FIG. 1.
Figure 3:
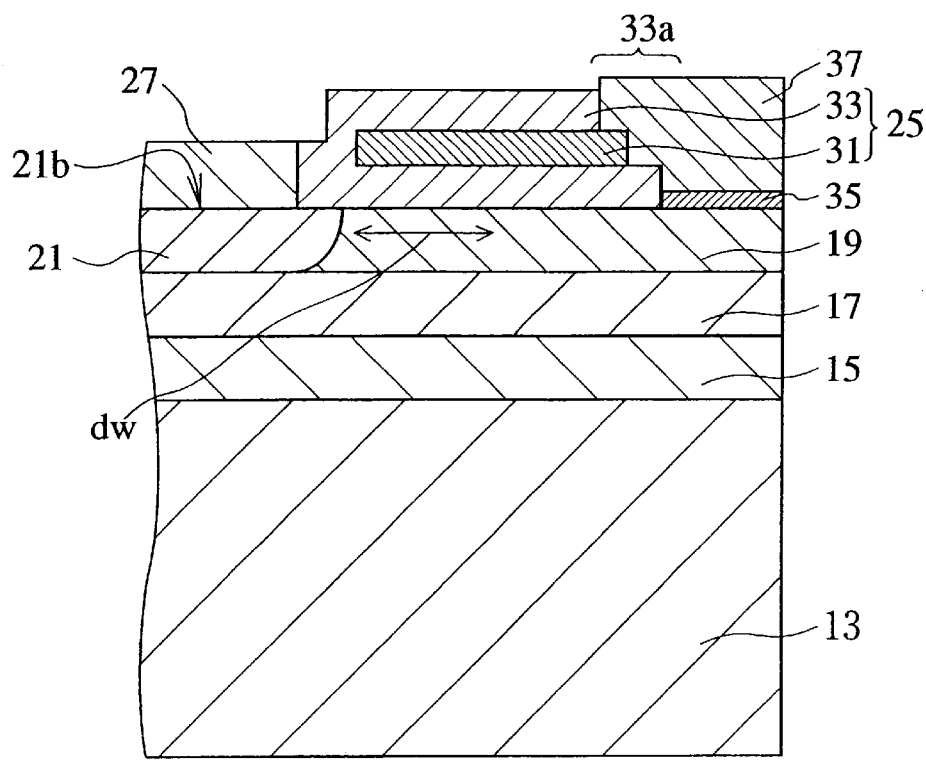
FIG. 3 is a diagram schematically depicting in enlarged form part of a cross section made along line A—A in FIG. 1 in order to illustrate the structure of the shielding film cladding.

FIG. 1 is a plan view schematically depicting a semiconductor light-receiving element that pertains to an embodiment (in the example illustrated, a planar photodiode is considered). In FIG. 1, the semiconductor light-receiving element is viewed in the direction perpendicular to the light-receiving surface of the element. For the sake of clarity, some of the parts inside the semiconductor light-receiving element are indicated by broken lines. FIG. 2 is a fragmentary perspective cross-sectional view of the semiconductor light-receiving element in FIG. 1. FIG. 2 is a cross section along a plane perpendicular to the light-receiving surface, giving a structural overview of the shielding film cladding. FIG. 3 is a diagram schematically depicting in enlarged form part of a cross section made along line A—A in FIG. 1 in order to illustrate the structure of the shielding film cladding. For the sake of simplicity, the components in FIG. 3 are not shown to scale. In particular, the dimensions of these components are reduced in the direction parallel to the substrate surface.

A semiconductor light-receiving element of this embodiment will now be described with reference to FIGS. 1, 2, and 3.

As shown in FIG. 2, a semiconductor light-receiving element 11 is obtained by forming a cladding comprising layers of a first conduction type (that is, an $n^-$-InP buffer layer 15, an $n^-$-InGaAs light-absorbing layer 17, and a $n^-$-InP window layer 19) on the first principal surface 13a of an InP substrate 13 of the first conduction type (n type). The cladding may be formed by a common crystal growth technique. Part of the window layer 19 is provided with a $p^+$ diffusion region 21, which is a diffusion region of a second conduction type reaching all the way to the boundary between the window layer 19 and the light-absorbing layer 17. The $p^+$ diffusion region 21 may be formed, for example, by the selective diffusion of zinc (Zn) or cadmium (Cd) in the window layer 19.

Part of the $p^+$ diffusion region 21 serves as a light-receiving surface 21a for receiving light, and an antireflection film 23 is commonly formed on this surface. Another part of the $p^+$ diffusion region 21 serves as a light-nonreceiving surface 21b, and this light-nonreceiving surface 21b is provided with a p-type electrode 27 as a first main electrode on the $p^+$ diffusion region 21 in contact with this p diffusion region 21. The second principal surface 13b of the substrate 13 is provided with an n-type electrode 29.

As shown in FIG. 2, a shielding film cladding 25 is formed above the window layer 19 around the $p^+$ diffusion region 21. In this embodiment, the light-receiving surface 21a of the $p^+$ diffusion region 21 is shaped in a circle as a flat pattern, and the light-nonreceiving surface 21b is configured as a crescent-shaped flat pattern adjacent to the light-receiving surface 21a within the same plane, as shown in FIG. 1.

FIG. 3 schematically depicts in enlarged form part of a section through the shielding film cladding 25. The shielding film cladding 25 is obtained by cladding a shielding metal film 31 and an insulating film 33. The shielding metal film 31 is a structural component of the shielding film cladding 25. The insulating film 33 covers the top and bottom surfaces of the shielding metal film 31 (as shown, for example, in FIG. 3). Specifically, the shielding metal film 31 is sandwiched between insulating films 33.

As shown in Reference I, electrical floating of the shielding metal film 31 increases element capacitance and results in a lower element response speed. Providing an ohmic electrode 35 controls this phenomenon, however.

The shielding metal film 31 is also electrically connected to the window layer 19 via the ohmic electrode 35. A silicon nitride film (SiN film) may, for example, be used as the insulating film 33.

In the particular structure depicted in FIG. 3, a connection electrode 37 is electrically connected between the ohmic electrode 35 and the shielding metal film 31. As can be seen in FIG. 3, forming the ohmic electrode 35 following the formation of a sandwich-shaped insulating film 33 makes it more likely that the material for forming the ohmic electrode 35 will provide inadequate step coverage for a stepped portion 33a, which is obtained by the stepwise cladding of the insulating film 33 and the shielding metal film 31. The shielding metal film 31 generally assumes a an electrical floating state when inadequate contact is created by poor step coverage of the stepped portion 33a. The connection electrode 37 is therefore formed from a forming material having comparatively good step coverage characteristics after the ohmic electrode 35 and the shielding metal film 31 have been formed as described. The electrical connection between the ohmic electrode 35 and the shielding metal film 31 can thus be made more secure. The thicknesses of the ohmic electrode 35 and the connection electrode 37 may, for example, be about 500 Å and about 5000 Å, respectively. In addition, ohmic contact can be easily realized by forming the ohmic electrode from an alloy of gold (Au) and zinc (Zn) when the connection electrode 37 is formed from gold (Au), for example. In this case, the shielding metal film 31 may, for example, be formed from titanium (Ti).

It is appropriate to form the connection electrode 37 from a material having the same type of conductivity as the p-type electrode 27 because in this case the connection electrode 37 and the p-type electrode 27 can be formed by the same process. The connection electrode 37 and the p-type electrode 27 may, for example, be formed from gold (Au).

As shown in FIG. 1, the ohmic electrode 35 in the semiconductor light-receiving element 11 of the present embodiment encircles the $p^+$ diffusion region 21 while in contact with the window layer of the substrate 13. In FIG. 1, the area above the substrate 13 and outside the light-receiving surface 21a and light-nonreceiving surface 21b is exposed to the shielding film cladding 25, and the insulating film 33 is exposed as the outermost layer in this region.

As indicated in Reference I, the ohmic electrode 35 should preferably be positioned farther away from the $p^+$ diffusion region 21 than the width dw of the depletion layer formed around the $p^+$ diffusion region 21. This approach reduces the likelihood that short circuits will occur between the $p^+$ diffusion region 21 and the ohmic electrode 35 (see FIG. 3).

Figure 4:
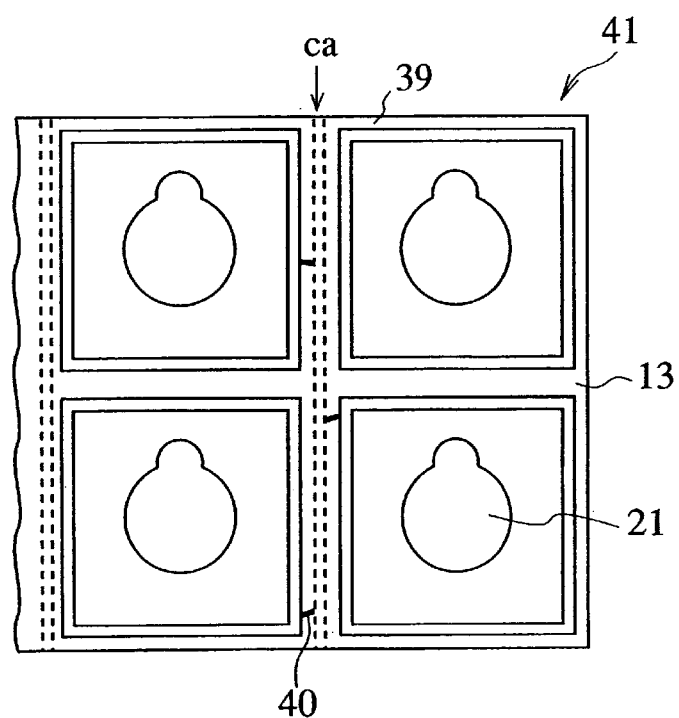
FIG. 4 is a front view of a wafer on which a plurality of semiconductor light-receiving elements that pertain to an embodiment are formed as an array.

FIG. 4 is a front view of a wafer on which a plurality of semiconductor light-receiving elements 11 thus configured are formed as an array. A dicing cut is made in the cutting area ca in FIG. 4. Cracks 40 tend to form in the edgewise area 39 of the elements when the wafer 41 in FIG. 4 is split in order to separate the elements from each other. The cracks are prevented from spreading and reaching the $p^+$ diffusion region 21, however, because the ohmic electrode 35 is provided such that at least the region 21 is encircled, as described above.

In the particular case shown in FIG. 1, an ohmic electrode 35 is provided in the edgewise region 39 of the substrate 13, making it possible to limit cracks (which are apt to form along the external periphery of the substrate) to the edgewise region 39 of the substrate and impeding cracking in the $p^+$ diffusion region 21 or in regions other than the substrate 13 (that is, regions inside the edgewise region 39). The connection electrode 37 depicted in FIG. 3 and elsewhere is omitted from FIG. 1.

In addition, common semiconductor light-receiving elements are handled using pincers or the like during mounting. As indicated above, parts of the semiconductor light-receiving elements sometimes are chipped during such handling. When the semiconductor light-receiving elements are of the type described, for example, in Reference I, the ohmic electrodes sometimes break off, increasing the element capacitance. In the semiconductor light-receiving element 11 of the present embodiment, however, the electrical connection with the shielding metal film 31 can be maintained by means of the ohmic electrode 35 in the unbroken portion when the substrate 13 is partially chipped and the corresponding portion of the ohmic electrode 35 breaks off.

When, for example, such cracking occurs as a result of substrate strain or the like following the mounting of the semiconductor light-receiving element 11, the cracks will be unlikely to reach at least the $p^+$ diffusion region 21.

In particular, an indium/phosphorus (InP) substrate is used in the present embodiment. Indium/phosphorus substrates are known to be weak materials that are easily cracked or chipped. With a structure such as that described above, however, favorable results are obtained because the occurrence or propagation of cracks or chips can be controlled.

Figure 5A:
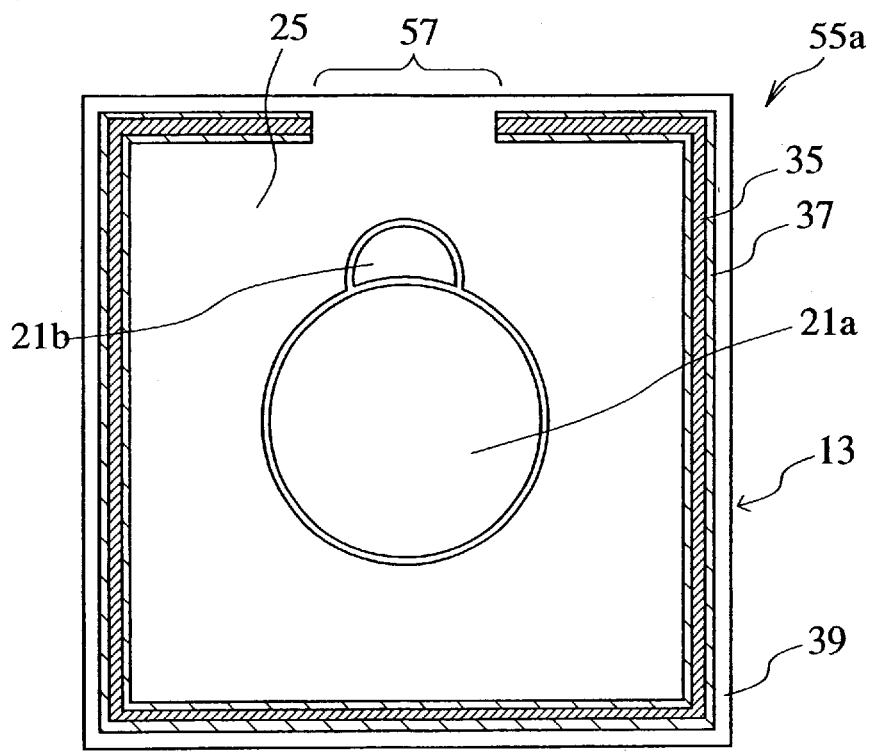
FIG. 5 (FIGS. 5A and 5B) is a plan view schematically depicting a specific structure of a planar photodiode.
Figure 5B:
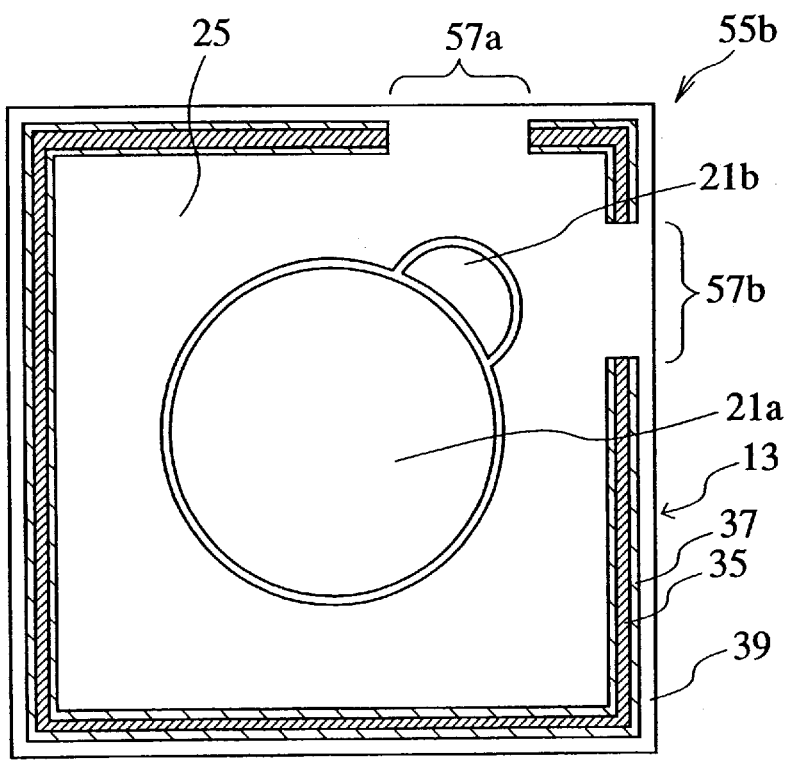

FIGS. 5A and 5B are plan views schematically depicting a specific structure of a planar photodiode. For the sake of convenience, FIG. 5 depicts a case in which the ohmic electrode 35 appears to be underneath the connection electrode. In the planar photodiodes 55a and 55b in FIGS. 5A and 5B, the ohmic electrode 35 is provided only to the edgewise region 39 of the substrate 13 along the external periphery of the substrate 13. The ohmic electrode 35 is in contact with the bottom of the connection electrode 37.

A discontinuous section 57 is provided to a curvilinear pattern obtained by forming an electrode pattern from the ohmic electrode 35 in the planar photodiode 55a of FIG. 5A. The discontinuous section 57 should preferably be positioned as close as possible to the p-type electrode (formed on the light-nonreceiving surface 21b), as shown in FIG. 5A. A bonding wire or other component for connecting the p-type electrode to the outside is provided above the discontinuous section 57. It is therefore less likely that the connection electrode 37 will be shorted by the breakage of the bonding wire or the like.

Discontinuous sections 57a and 57b are provided to a curvilinear pattern obtained by forming an electrode pattern from the ohmic electrode 35 in the planar photodiode 55b of FIG. 5B. In this structural example as well, the discontinuous sections 57a and 57b should preferably be positioned as close as possible to the p-type electrode.

A variety of elements other than an InP-based compound semiconductor light-receiving element may be used for the above-described semiconductor light-receiving element. In addition, the shielding metal film may also be formed from molybdenum (Mo). The semiconductor light-receiving element may be formed using materials other than those described above. The semiconductor light-receiving element of the present invention may be used as a PIN photodiode, avalanche photodiode, or other photodiode. Typically, the element is suitable for use as a planar photodiode, but may also be used as an end-face light-receiving type.

As is evident from the above description, the ohmic electrode of the semiconductor light-receiving element of the present invention is disposed such that this electrode is in contact with a window layer and encircles a diffusion region, making it possible to prevent cracks from reaching all the way inside the ohmic electrode while preserving the excellent characteristics of the semiconductor light-receiving element according to Reference I. Cracking is thus less likely to develop in the diffusion region, and the cracking-induced deterioration of element characteristics is minimal. In addition, element characteristics are unlikely to be adversely affected when, for example, the ohmic electrode on the opposite sides of the element breaks off as a result of substrate chipping.

What is claimed is:

1. A semiconductor light-receiving element, comprising:

a light-absorbing layer of a first conduction type and a window layer of the first conduction type, sequentially formed on the first principal surface of a substrate of the first conduction type;

a diffusion region of a second conduction type, provided to part of said window layer and extended as far as the boundary between said window layer and said light-absorbing layer; and a shielding film cladding, formed on said window layer around said diffusion region; wherein said shielding film cladding is constructed by cladding a shielding metal film and an insulating film;

said shielding metal film is part of said shielding film cladding and is electrically connected to said window layer by means of an ohmic electrode; and said ohmic electrode is provided so as to encircle said diffusion region while in contact with said window layer.

2. A semiconductor light-receiving element according to claim 1, wherein said substrate is an indium/phosphorus-based substrate.

3. A semiconductor light-receiving element according to claim 1, wherein a connection electrode is further provided for electrically connecting said ohmic electrode and said shielding metal film.

4. A semiconductor light-receiving element according to claim 3, wherein said diffusion region is provided with a first main electrode in contact with said diffusion region, and said connection electrode and said first main electrode are formed from the same electroconductive material.

5. A semiconductor light-receiving element according to claim 1, wherein said ohmic electrode is provided in the edgewise region of said substrate along the external periphery of said substrate.

6. A semiconductor light-receiving element according to claim 1, wherein the second principal surface of said substrate is provided with a second main electrode.

7. A semiconductor light-receiving element according to claim 1, wherein said substrate is an InP substrate, said light-absorbing layer is an InGaAs layer, and said window layer is an InP layer.

8. A semiconductor light-receiving element according to claim 7, wherein an InP buffer layer is provided between said InP substrate and said InGaAs layer.

9. A semiconductor light-receiving element according to claim 1, wherein part of said diffusion region functions as a light-receiving surface, and an antireflection film is formed on said light-receiving surface.

10. A semiconductor light-receiving element according to claim 9, wherein the light-nonreceiving surface of said diffusion region is provided with a first main electrode in contact with said diffusion region.

11. A semiconductor light-receiving element according to claim 10, wherein said light-receiving surface is shaped as a circular flat pattern, and said light-nonreceiving surface is configured as a crescent-shaped flat pattern adjacent to said light-receiving surface within the same plane.

12. A semiconductor light-receiving element according to claim 1, wherein a silicon nitride film is used as said insulating film.

13. A semiconductor light-receiving element according to claim 3, wherein said ohmic electrode is formed from an alloy of gold (Au) and zinc (Zn) if said connection electrode is formed from gold (Au).

14. A semiconductor light-receiving element according to claim 1, wherein said shielding metal film is formed from titanium (Ti) or molybdenum (Mo).

15. A semiconductor light-receiving element according to claim 1, wherein said ohmic electrode is electrically connected to said window layer at a position farther away from said diffusion region than the width of a depletion layer formed around said diffusion region.

16. A semiconductor light-receiving element according to claim 1, wherein said diffusion region is provided with a first main electrode in contact with said diffusion region, a discontinuous section is provided to a curvilinear pattern obtained by forming an electrode pattern from said ohmic electrode, and said discontinuous section is disposed at the closest position to said first main electrode.

* * * * *